United States Patent
Suh et al.

(10) Patent No.: US 7,816,724 B2
(45) Date of Patent: *Oct. 19, 2010

(54) MEMORY DEVICE WITH BARRIER LAYER

(75) Inventors: Youseok Suh, Cupertino, CA (US); Satoshi Torii, Sunnyvale, CA (US); Lei Xue, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 251 days.

This patent is subject to a terminal disclaimer.

(21) Appl. No.: 11/997,464

(22) PCT Filed: Jul. 21, 2006

(86) PCT No.: PCT/US2006/028539

§ 371 (c)(1),
(2), (4) Date: Jan. 31, 2008

(87) PCT Pub. No.: WO2007/019027

PCT Pub. Date: Feb. 15, 2007

(65) Prior Publication Data

US 2008/0191269 A1 Aug. 14, 2008

(51) Int. Cl.
*H01L 29/788* (2006.01)
(52) U.S. Cl. ............................ 257/316; 257/E27.078
(58) Field of Classification Search ......... 257/316–321, 257/E27.078; 438/257–267
See application file for complete search history.

(56) References Cited

U.S. PATENT DOCUMENTS

| 6,248,628 | B1 | 6/2001 | Halliyal et al. | 438/257 |
| 6,596,590 | B1 | 7/2003 | Miura et al. | 438/261 |
| 7,053,445 | B1 * | 5/2006 | Suh et al. | 257/316 |
| 2002/0145161 | A1 | 10/2002 | Miura et al. | 257/314 |
| 2004/0169238 | A1 | 9/2004 | Lee et al. | 257/406 |
| 2005/0093054 | A1 | 5/2005 | Jung | 257/310 |
| 2005/0194627 | A1 | 9/2005 | Nomoto et al. | 257/296 |

OTHER PUBLICATIONS

International Search Report and Written Opinion for PCT Application No. PCT/US2006/028539, mailed Dec. 8, 2006, 12 pages.
Co-pending U.S. Appl. No. 11/135,42, filed May 24, 2005, entitled "Interface Layer Between Dual Polycrystalline Silicon Layers", Mark Ramsbey et al., 20 pages.

* cited by examiner

*Primary Examiner*—Richard A. Booth
(74) *Attorney, Agent, or Firm*—Harrity & Harrity, LLP (57) ABSTRACT

A memory device (100) may include a substrate (110), a dielectric layer (210) formed on the substrate (110) and a charge storage element (220) formed on the dielectric layer (210). The memory device (100) may also include an inter-gate dielectric (230) formed on the charge storage element (220), a barrier layer (240) formed on the inter-gate dielectric (230) and a control gate (250) formed on the barrier layer (240). The barrier layer (240) prevents reaction between the control gate (250) and the inter-gate dielectric (230).

19 Claims, 14 Drawing Sheets

MEMORY DEVICE WITH BARRIER LAYER

TECHNICAL FIELD

The present invention relates generally to semiconductor devices and methods of manufacturing semiconductor devices. The invention has particular applicability to memory devices and improving reliability for memory devices.

BACKGROUND ART

The escalating demands for high density and performance associated with non-volatile memory devices, such as electrically erasable programmable read only memory (EEPROM) devices, require small design features, high reliability and increased manufacturing throughput. The reduction of design features, however, challenges the limitations of conventional methodology. For example, the reduction of design features makes it difficult for the memory device to meet its expected data retention requirement.

One particular problem with non-volatile memory devices involves reactions between the control gate and an inter-gate dielectric formed between the control gate and a charge storage element. For example, reactions at the interface between the control gate and an inter-gate dielectric, including inter-gate dielectrics having a high dielectric constant (K) value, have been shown to result in modification of the work function of the control gate. The reactions between the control gate and the inter-gate dielectric may also result in dopant diffusion from the control gate into other layers and degradation of the inter-gate dielectric. These problems may make it difficult for the memory device to be efficiently programmed and/or erased. In addition, these problems may make it difficult for the memory device to meet the expected data retention requirement and, ultimately, may lead to device failure.

DISCLOSURE OF THE INVENTION

Implementations consistent with the invention provide memory devices with a barrier layer formed between the control gate and the inter-gate dielectric. The barrier layer may prevent reactions between the control gate and the inter-gate dielectric.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a memory device is provided. The memory device includes a substrate, a first dielectric layer formed on the substrate and a charge storage element formed on the first dielectric layer. The memory device also includes a second dielectric layer formed on the charge storage element and a conductive layer comprising ruthenium formed on the second dielectric layer. The memory device further includes a control gate formed on the conductive layer.

According to another aspect consistent with the invention, a non-volatile memory device that includes a plurality of memory cells is provided. Each of the memory cells includes a dielectric layer formed on a substrate, a charge storage element formed on the dielectric layer and an inter-gate dielectric formed on the charge storage element. Each of the memory cells further includes a barrier layer formed on the inter-gate dielectric and a control gate formed on the barrier layer, where the barrier layer prevents reaction between the control gate and the inter-gate dielectric.

According to a further aspect consistent with the invention, a memory device includes a substrate, a first dielectric layer formed on the substrate and a charge storage element formed on the first dielectric layer. The memory device also includes an inter-gate dielectric formed on the charge storage element, a conductive layer formed on the inter-gate dielectric and a control gate formed on the conductive layer.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Figure 1:
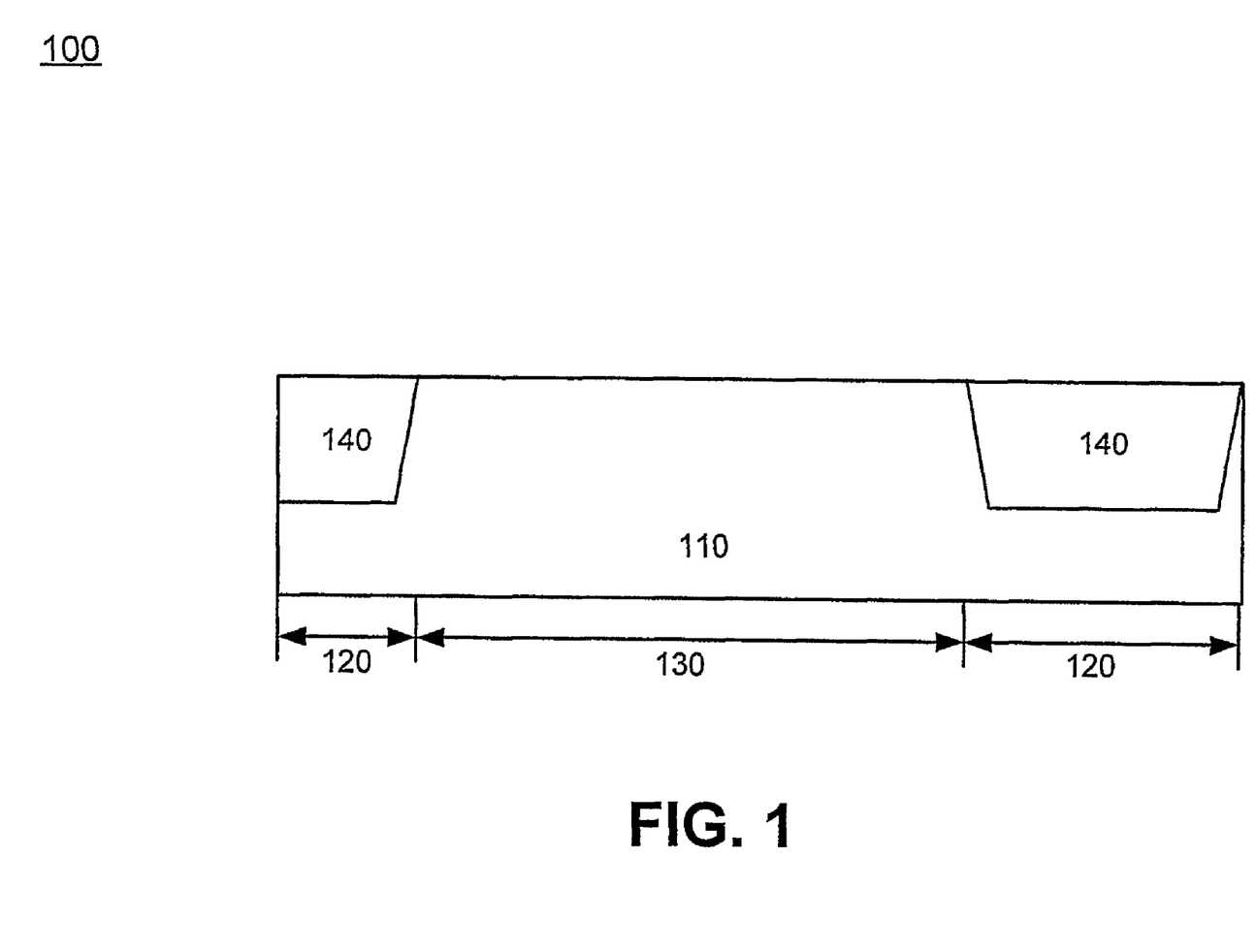
FIG. 1 is a cross-section illustrating the formation of active and isolation regions in a semiconductor device in accordance with an embodiment of the invention.

FIG. 1 is a cross-section illustrating the formation of active and isolation regions in a semiconductor device in accordance with an embodiment of the invention. Referring to FIG. 1, semiconductor device 100 may include a layer 110 divided into isolation regions 120 and an active region 130. Only two isolation regions 120 and one active region 130 are shown in FIG. 1 for simplicity. It should be understood that semiconductor device 100 may include a large number of active regions 130 and isolation regions 120.

In an exemplary embodiment, layer 110 may be a substrate of semiconductor device 100 and may include silicon (e.g., polycrystalline silicon), germanium, silicon-germanium or other semiconducting materials. In alternative implementations, layer 110 may be a conductive layer or a dielectric layer formed a number of layers above the surface of a substrate in semiconductor device 100.

In an exemplary implementation, trenches may be formed in substrate 110 in a conventional manner. For example, trenches may be formed in semiconductor substrate 110 in areas designated as isolation regions 120. The trenches may then be filled with a dielectric material, such as a silicon oxide (e.g., $SiO_2$), to form isolation regions 140, as illustrated in FIG. 1. Isolation regions 140, also referred to as shallow trench isolation (STI) regions 140, function to isolate active regions in semiconductor device 100. For example, STI regions 140 may isolate a source/drain region formed in one active region that is associated with one memory cell from a source/drain region in another active region associated with another memory cell. Although not shown in FIG. 1, the upper surface of STI regions 140 may protrude a small amount above the upper surface of substrate 110.

Figure 2A:
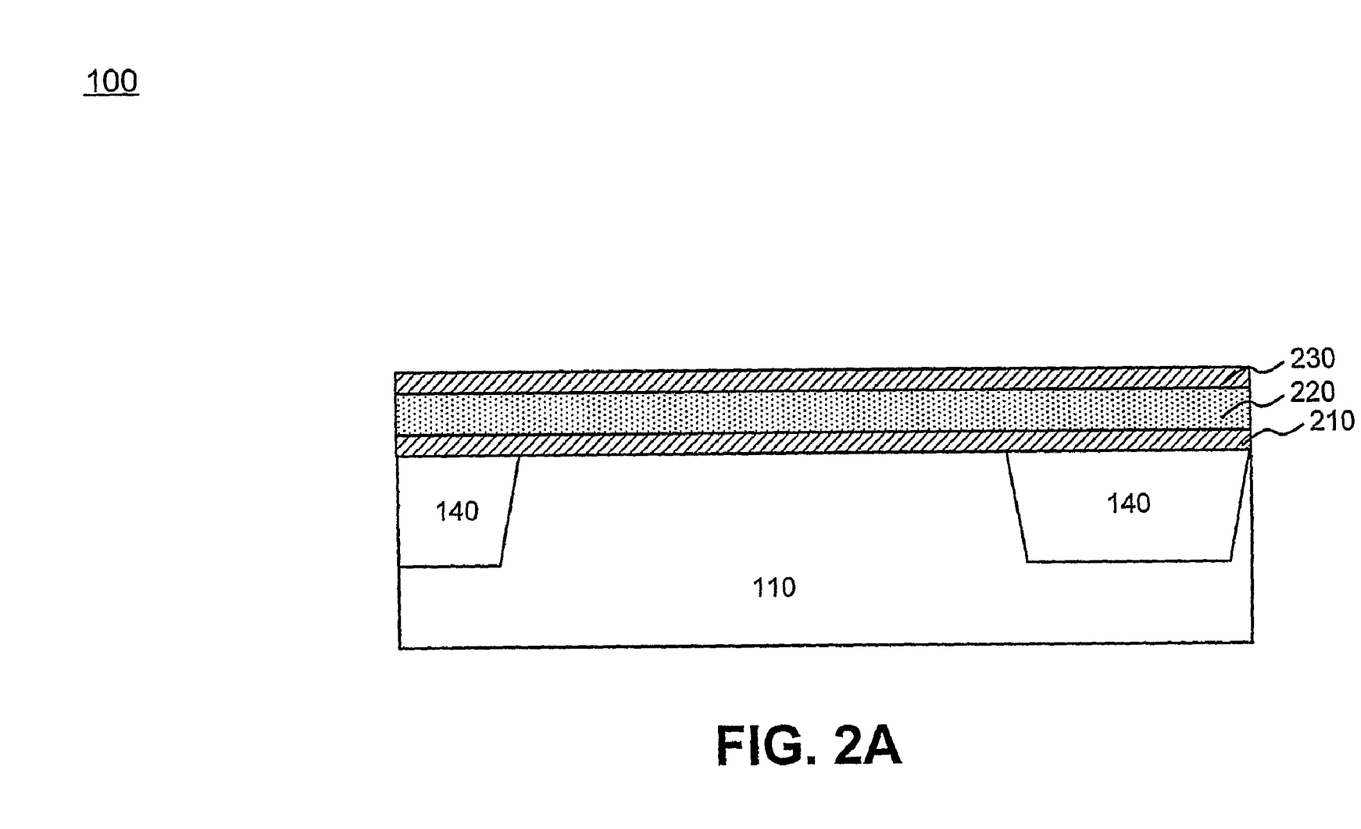
FIGS. 2A-2C are cross-sections illustrating exemplary layers used to form memory cells in accordance with an embodiment of the invention.

One or more layers may then be formed over semiconductor device 100. For example, layers 210, 220 and 230 may formed over semiconductor device 100, as illustrated in FIG. 2A. Layer 210 may be a dielectric layer formed on layer 130 in a conventional manner. In an exemplary implementation, dielectric layer 210 may include an oxide, such as a silicon oxide (e.g., $SiO_2$), and may have a thickness ranging from about 15 angstroms (Å) to about 100 Å. Dielectric layer 210 may function as a tunnel oxide layer for a subsequently formed memory cell of semiconductor device 100. Alternatively, layer 210 may include a dielectric material having a high K value, such as a K value greater than 3.9 (i.e., the K value of $SiO_2$). For example, layer 210 may include an aluminum oxide (e.g., $Al_2O_3$), a hafnium oxide (e.g., $HfO_2$), or a zirconium oxide (e.g., $ZrO_2$).

Layer 220 may be formed on layer 210 in a conventional manner and may include a dielectric material, such as a nitride (e.g., a silicon nitride such as $Si_3N_4$) or an oxide (e.g., an aluminum oxide, such as $Al_2O_3$, or a hafnium oxide, such as $HfO_2$). Layer 220, consistent with the invention, may act as a charge storage layer for semiconductor device 100 and may have a thickness ranging from, for example, about 30 Å to about 100 Å. In alternative implementations, layer 220 may include a conductive material, such as polycrystalline silicon, used to form a floating gate electrode. In still other alternative implementations, layer 220 may include a number of small crystalline structures, such as nano-crystals, that may be used to store charges.

Layer 230 may be formed on layer 220 in a conventional manner and may include a dielectric material, such as an oxide (e.g., $SiO_2$). Alternatively, layer 230 may include a material having a high K value, such as aluminum oxide (e.g., $Al_2O_3$), hafnium oxide ($HfO_2$) or zirconium oxide ($ZrO_2$), that may be deposited or thermally grown on layer 220. In still other alternatives, layer 230 may be a composite that includes a number of dielectric layers or films. Layer 230 may have a thickness ranging from about 50 Å to about 100 Å and may function as an inter-gate dielectric for memory cells in semiconductor device 100.

Figure 2B:
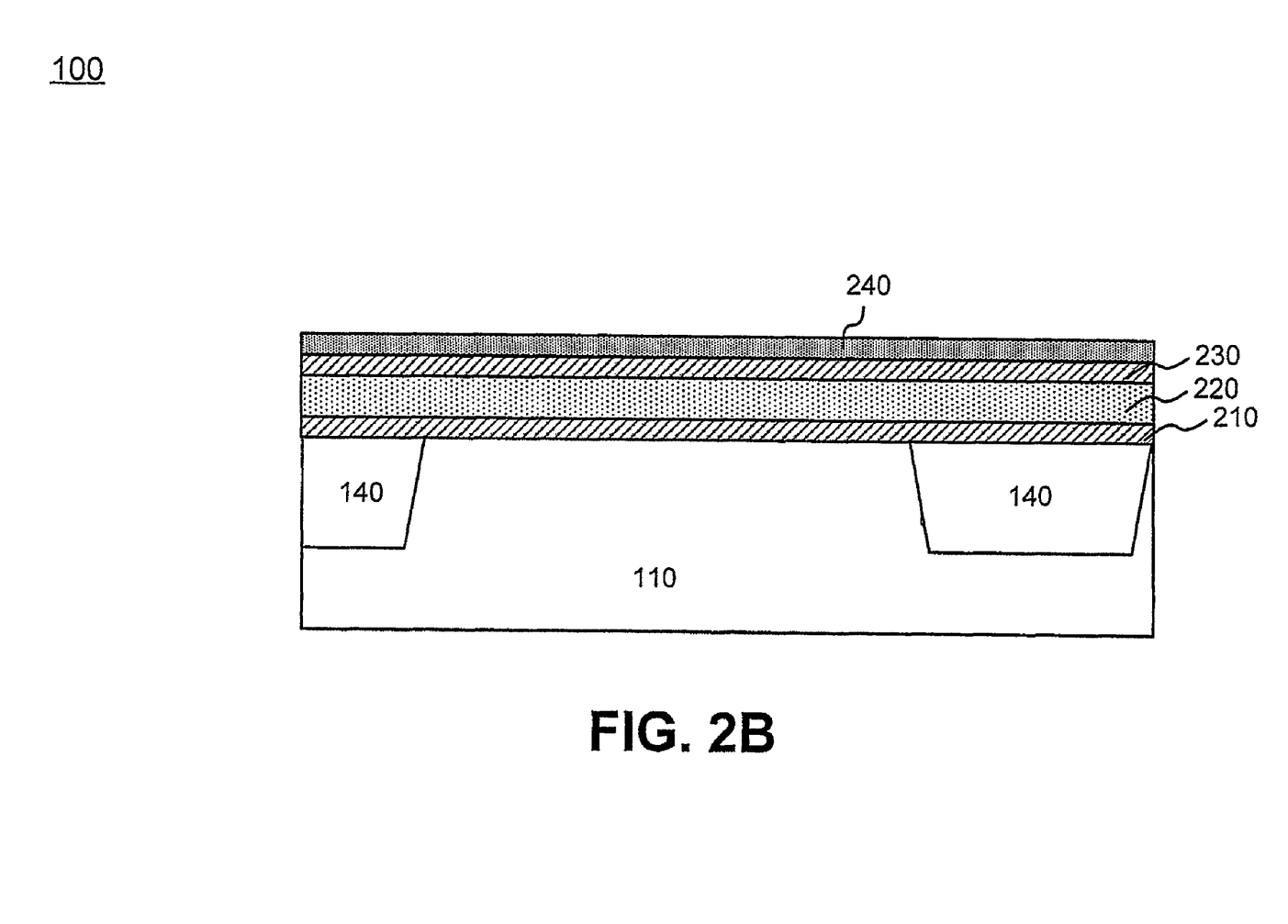

In conventional memory devices, a control gate layer may be formed directly over the inter-gate dielectric. In accordance with an embodiment consistent with the invention, a barrier layer may be deposited over layer 230 prior to forming the control gate layer. For example, in one embodiment, barrier layer 240 may be deposited over layer 230, as illustrated in FIG. 2B. In an exemplary embodiment, barrier layer 240 may include a conductive material, such as a ruthenium oxide (e.g., $RuO_2$). It has been found that $RuO_2$ has very good thermal stability and is able to prevent reactions between a subsequently deposited control gate layer and the inter-gate dielectric (i.e., layer 230). In this manner, barrier layer 240 is able to prevent modification of the work function of the subsequently deposited control gate layer resulting from reactions between the control gate layer and inter-gate dielectric 230. Barrier layer 240 also helps prevent dopant diffusion from the subsequently deposited control gate layer into inter-gate dielectric layer 230 and further helps prevent degradation of inter-gate dielectric layer 230 resulting from reactions between the control gate layer and inter-gate dielectric layer 230, particularly when inter-gate dielectric layer 230 includes a high-K material.

Barrier layer 240, consistent with an implementation of the invention, may be deposited via an oxidation process in which ruthenium is introduced into a chemical vapor deposition (CVD) chamber along with oxygen, subsequent to the formation of inter-gate dielectric 230. The ruthenium and oxygen react to form $RuO_2$ over inter-gate dielectric 230. In this manner, various parameters associated with barrier layer 240 may be controlled, such as the thickness of barrier layer 240, based on the particular end device requirements. For example, in an exemplary implementation, the thickness of barrier layer 240 may range from about 50 Å to about 500 Å. It should be understood, however, that other thicknesses associated with barrier layer 240 may be used in implementations of the invention.

In alternative implementations, barrier layer 240 may include other compounds, such as various metal-oxides (e.g., an iridium oxide, a zinc oxide, a cadmium oxide, etc.) or various metal-nitrides (e.g., a tantalum oxide, a titanium nitride, a tungsten nitride, etc.). In each case, barrier layer 240 advantageously prevents reactions between the control gate layer and inter-gate dielectric 230. Barrier layer 240 also is conductive so that the inclusion of barrier layer 240 in memory cell 310 does not adversely affect programming and/or erasing of the subsequently formed memory cells of semiconductor device 100.

Figure 2C:
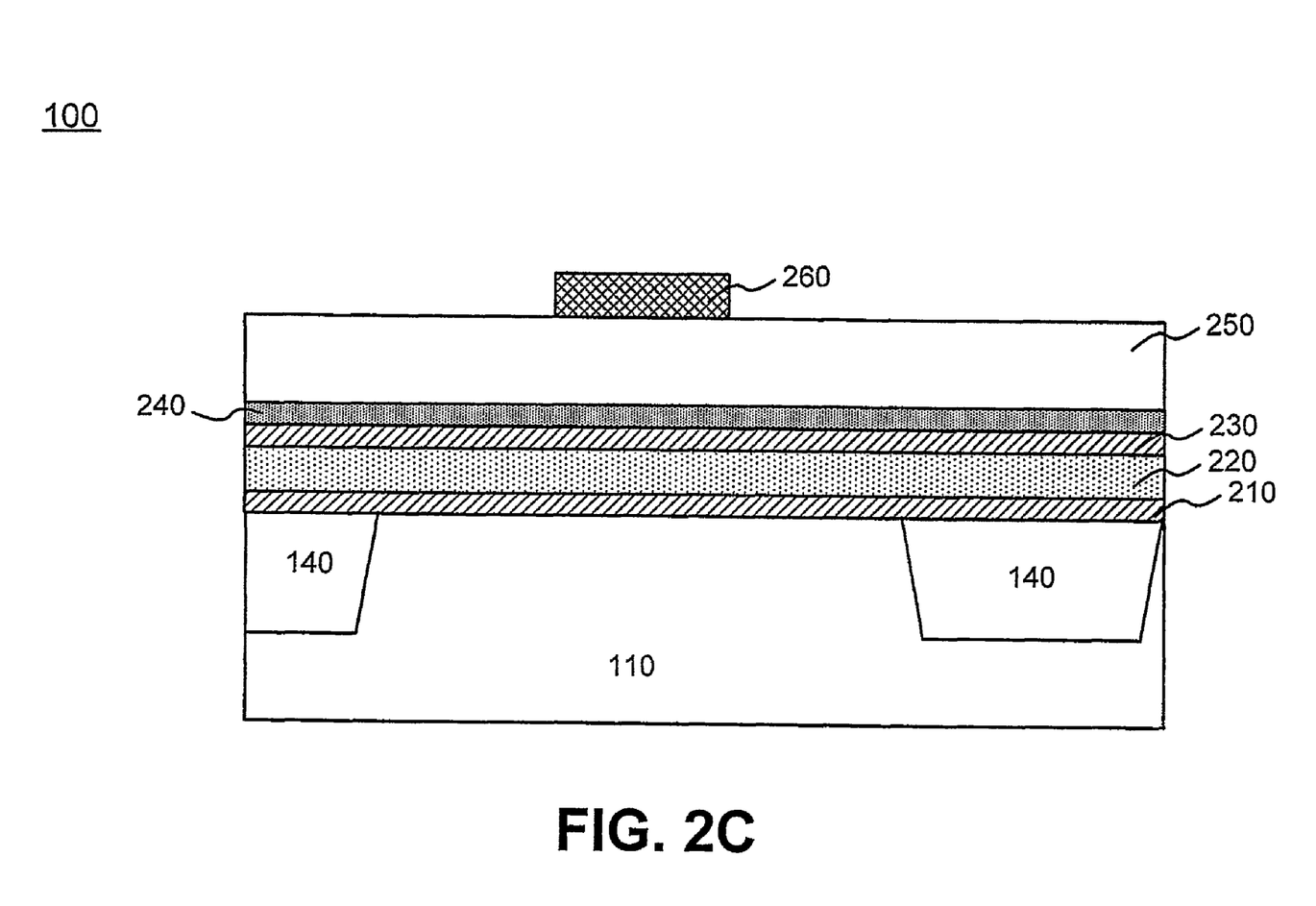

Layer 250 may be deposited over barrier layer 240, as illustrated in FIG. 2C. Layer 250 may include a conductive material, such as polycrystalline silicon, formed on barrier layer 240 in a conventional manner. Alternatively, layer 250 may include other semiconducting materials, such as germanium or silicon-germanium, or various metals, such as titanium or tungsten. Layer 250, consistent with the invention, may be used to form one or more control gate electrodes for one or more memory cells in semiconductor device 100. In an exemplary implementation, layer 250 may have a thickness ranging from about 500 Å to about 2,000 Å. An optional silicide layer, such as titanium silicide (not shown) may be formed on layer 250.

A photoresist material may be patterned and etched to form mask 260 on the top surface of layer 250, as illustrated in FIG. 2C. Mask 260 may be used to facilitate formation of memory cells in semiconductor device 100, as described in more detail below.

Figure 3:
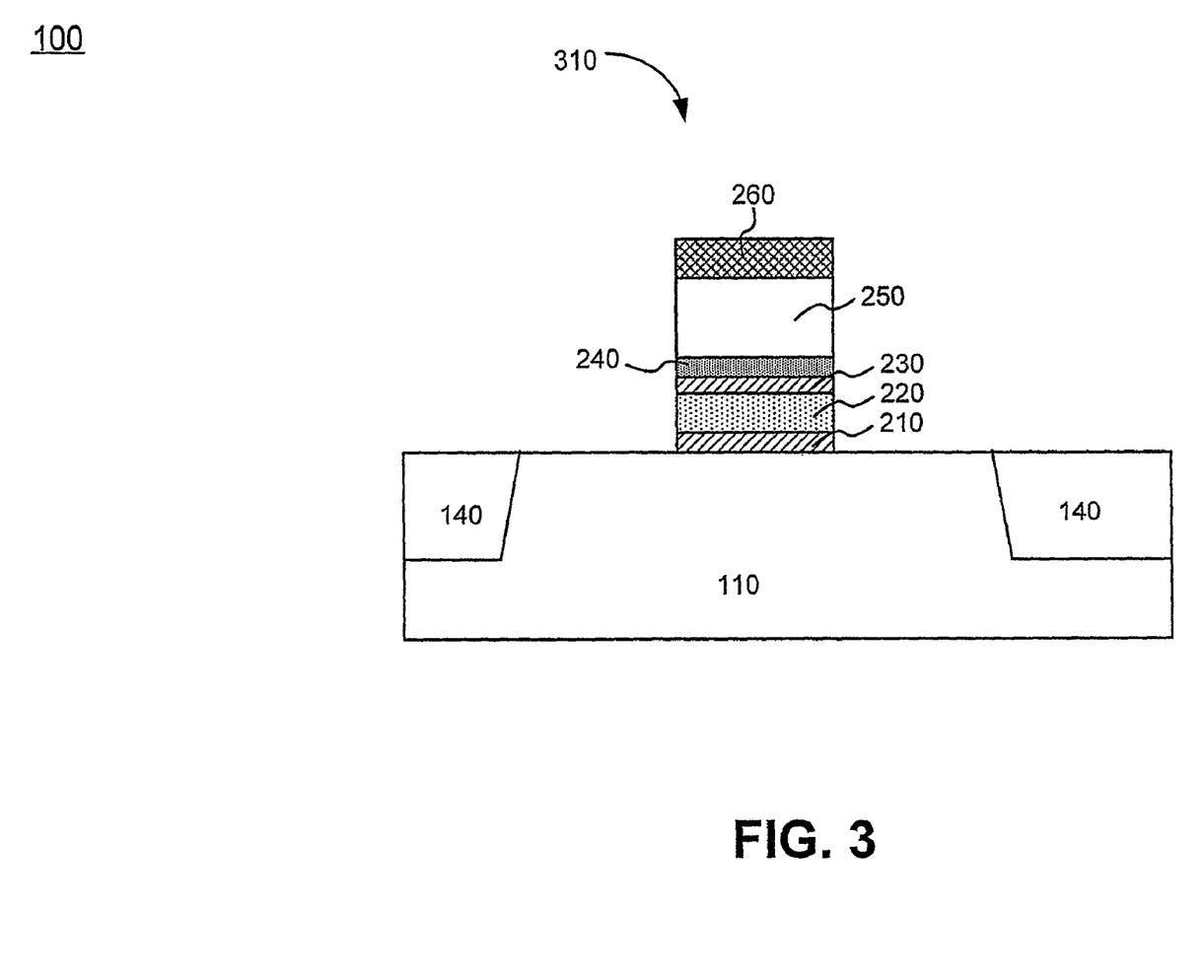
FIG. 3 is a cross-section illustrating the formation of an exemplary memory cell in accordance with an embodiment of the invention.

Semiconductor device 100 may then be etched, as illustrated in FIG. 3. Referring to FIG. 3, layers 210-250 may be etched in a conventional manner with the etching terminating at substrate 110, thereby forming structure 310. In alternative implementations, the etching may terminate at another layer, such as layer 230. Structure 310 (also referred to herein as a memory cell 310) may represent a memory cell of semiconductor device 100, where memory cell 310 includes a dielectric layer 210, a charge storage layer 220, an inter-gate dielectric layer 230, a barrier layer 240 and a control gate 250. Only one memory cell 310 is illustrated in semiconductor device 100 in FIG. 3 for simplicity. It should be understood that semiconductor device 100 may typically include a memory array including a large number of memory cells 310.

As discussed above, in an exemplary implementation consistent with the invention, each memory cell 310 may include a barrier layer 240 formed between control gate layer 250 and a top most inter-gate dielectric layer (e.g., layer 230). Barrier layer 240 advantageously prevents reactions between control gate layer 250 and inter-gate dielectric layer 230 that may adversely affect performance of memory cell 310.

Figure 4:
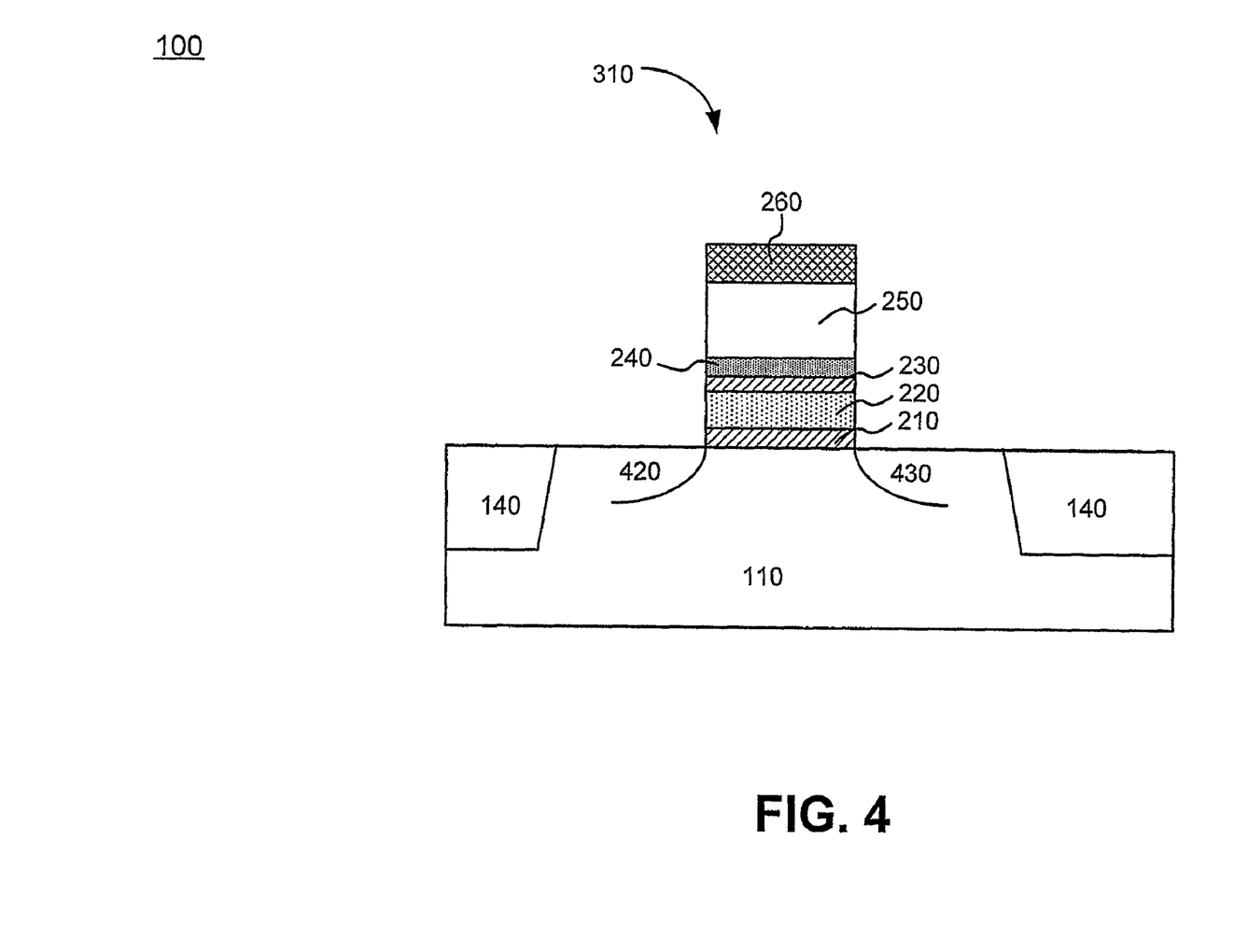
FIG. 4 is a cross-section illustrating the formation of source/drain regions in the device of FIG. 3 in accordance with an embodiment of the invention.

Source and drain regions 420 and 430 may be formed in substrate 110, as illustrated in FIG. 4. For example, n-type or p-type impurities may be implanted in substrate 110 to form source and drain regions 420 and 430, based on the particular end device requirements. The particular implantation dosages and energy used to form source and drain regions 420 and 430 may be selected based on the particular end device requirements. One of ordinary skill in the art would be able to optimize the source/drain implantation process based on the particular circuit requirements. It should also be understood that source region 420 and drain region 430 may alternatively be formed at other points in the fabrication process of semiconductor device 100. For example, sidewall spacers may be formed prior to the source/drain ion implantation to control the location of the source/drain junctions based on the particular circuit requirements.

Figure 5:
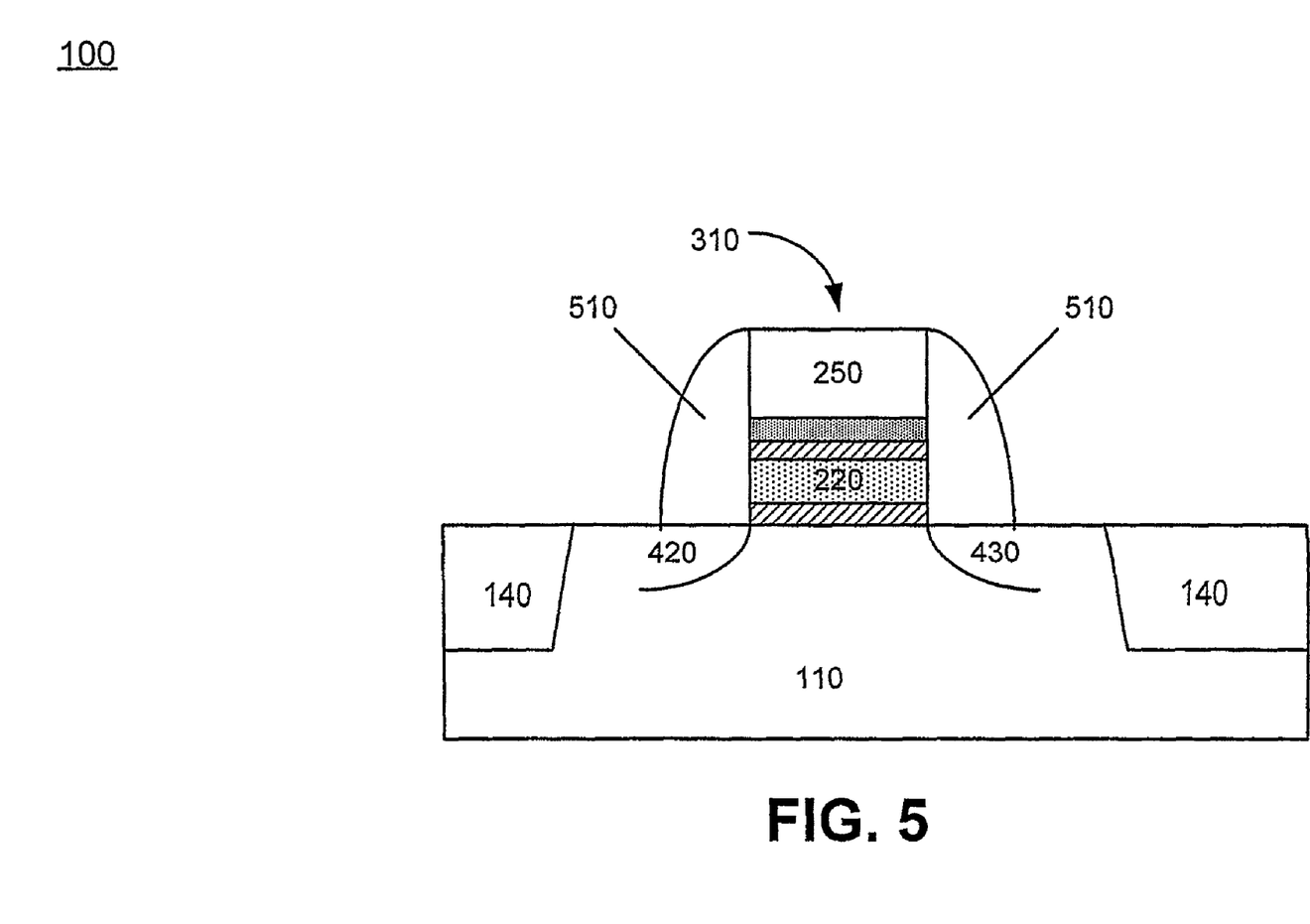
FIG. 5 is a cross-section illustrating the formation of spacers on the device of FIG. 4 in accordance with an embodiment of the invention.

Photoresist mask 260 may be removed using a conventional process. Spacers 510 may be formed adjacent the sidewalls of the memory cell 310, as illustrated in FIG. 5. For example, a dielectric material, such as a silicon oxide, a silicon nitride, a silicon oxynitride or another dielectric material, may be deposited and etched to form spacers 510 on each side of memory cell 310, as illustrated in FIG. 5. Spacers 510 may be used to electrically isolate adjacent memory cells 310 from each other. Spacers 510 may also be used to facilitate the deposition of impurities in semiconductor device 100.

Figure 6A:
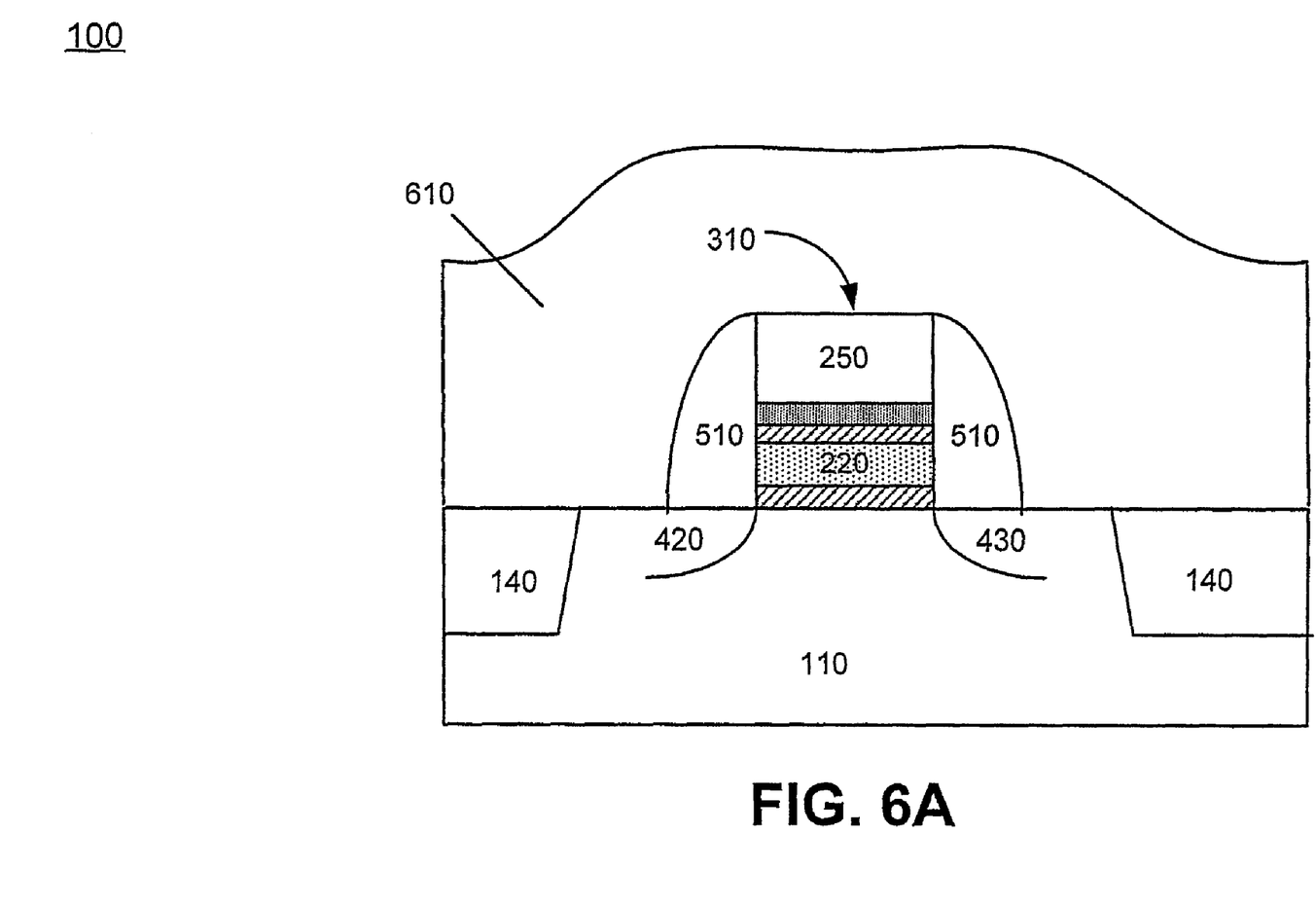
FIGS. 6A and 6B are cross-section illustrating the formation of an interlayer dielectric on the device of FIG. 5 in accordance with an embodiment of the invention.

An interlayer dielectric (ILD) 610 may be formed over memory cells 310 and substrate 110, as illustrated in FIG. 6A. In an exemplary implementation, ILD layer 610 may include an oxide (e.g., $SiO_2$), phosphosilicate glass (PSG) material, a boro-phosphosilicate glass (BPSG) material or some other dielectric material. The thickness of ILD 610 may range from about 2,000 Å to about 8,000 Å.

Figure 6B:
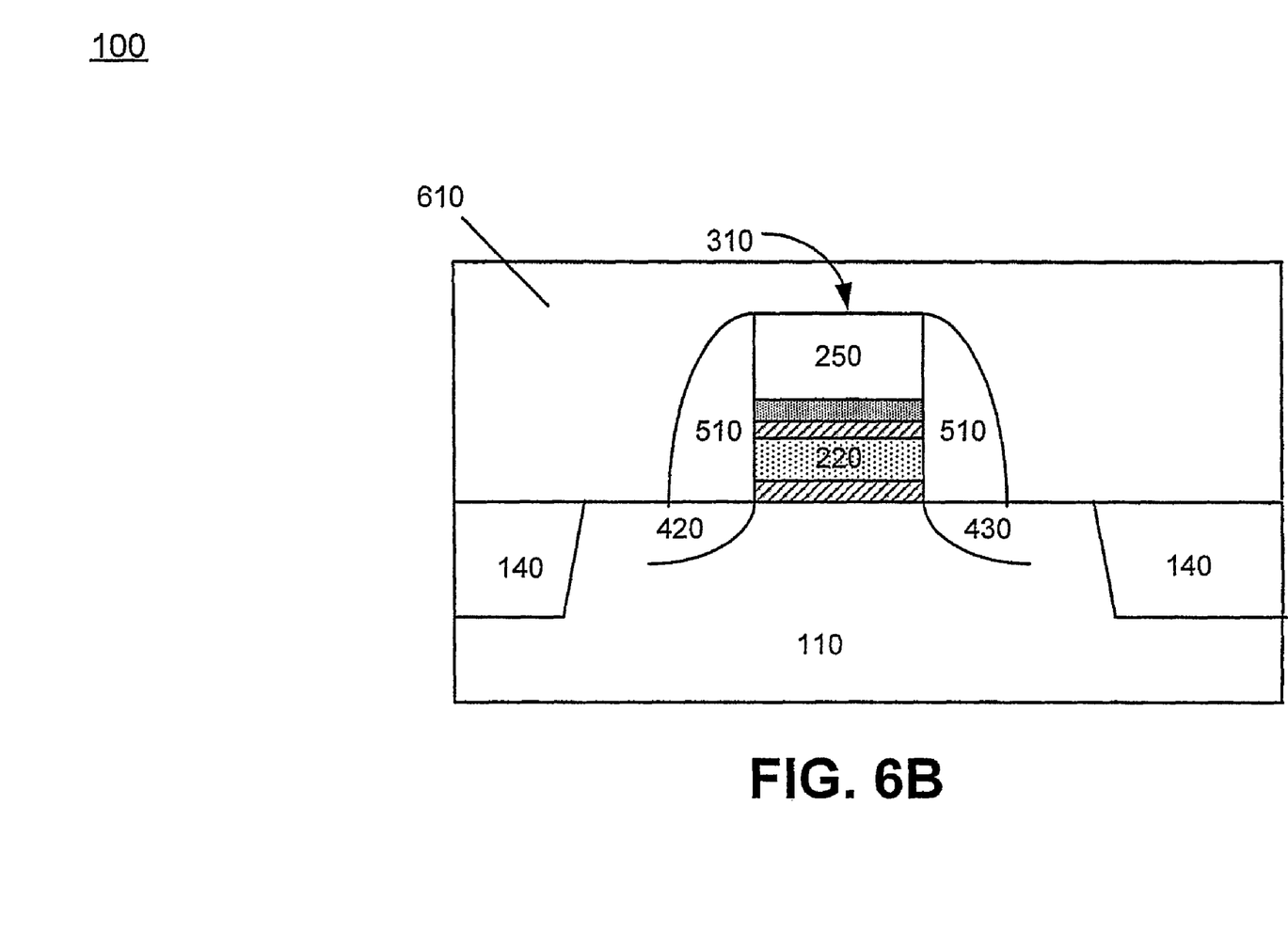

ILD 610 may optionally be planarized using a conventional process, such as a chemical-mechanical polishing (CMP) process, as illustrated in FIG. 6B. Referring to FIG. 6B, the CMP process may planarize the top surface of ILD 610 to facilitate formation of subsequent structures, such as interconnect lines. ILD 610, consistent with the invention, may represent an ILD located closest to substrate 110. In alternative implementations, ILD 610 may represent an interlayer dielectric formed a number of layers above the surface of substrate 110. In each case, ILD 610 functions to isolate various conductive structures, such as various interconnect lines described below or to isolate source region 420 or drain region 430 from other conductive structures.

Figure 7A:
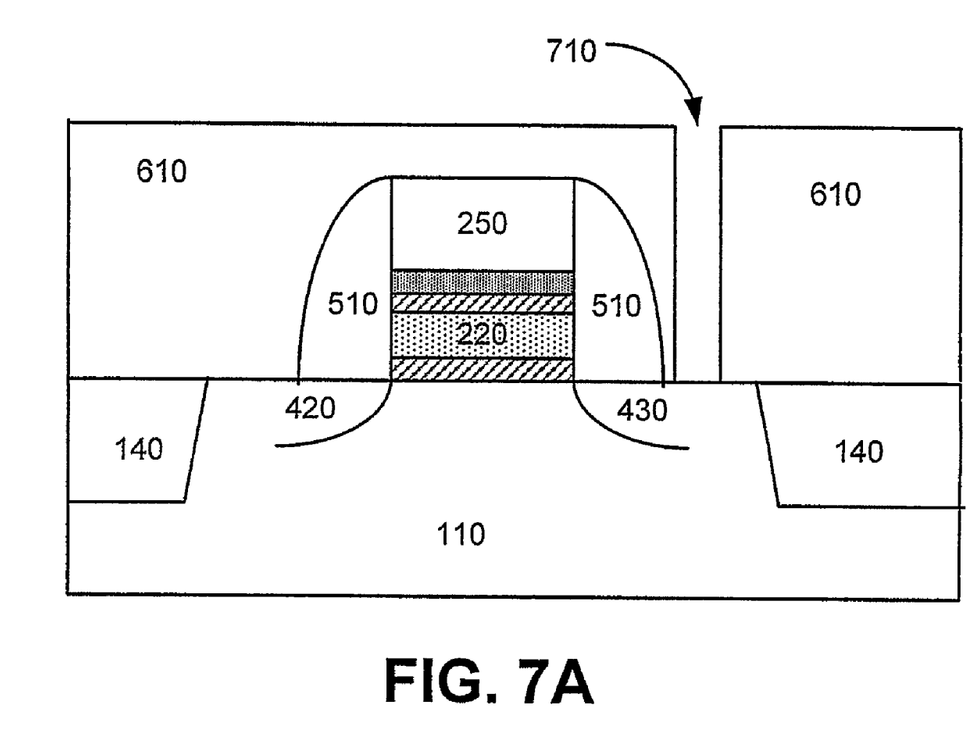
FIGS. 7A and 7B are cross-sections illustrating the formation of a contact in the interlayer dielectric of FIG. 6B in accordance with an embodiment of the invention.
Figure 7B:
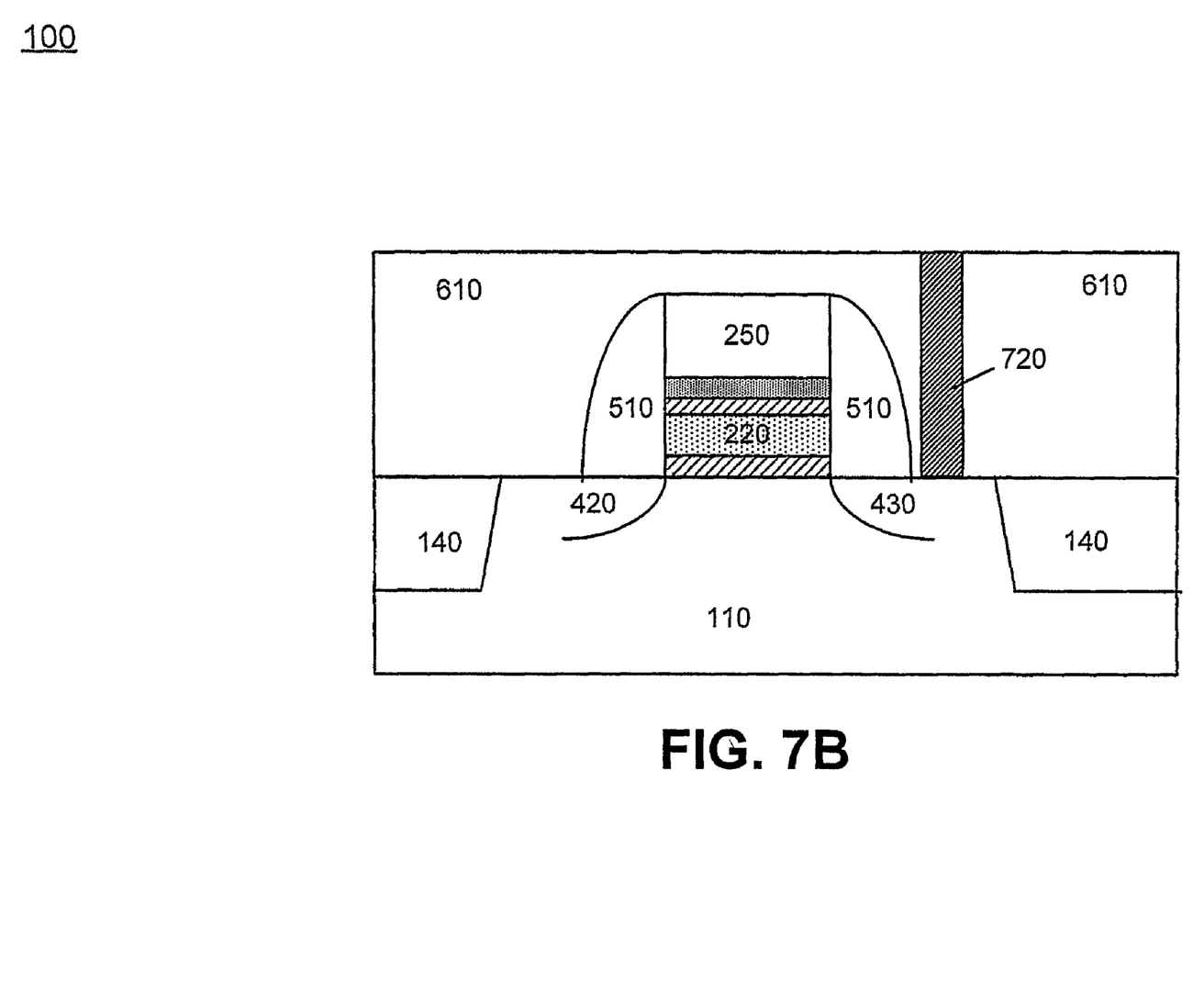

A contact hole/trench 710 may be formed in ILD 610 using conventional photolithographic and etching techniques, as illustrated in FIG. 7A. Contact hole 710 may be used to form a contact to, for example, drain region 430. Next, a metal layer 720, such as tungsten, copper or aluminum, may be deposited to fill contact hole 710, as illustrated in FIG. 7B. Metal layer 720 may represent a contact to drain region 430.

Figure 8:
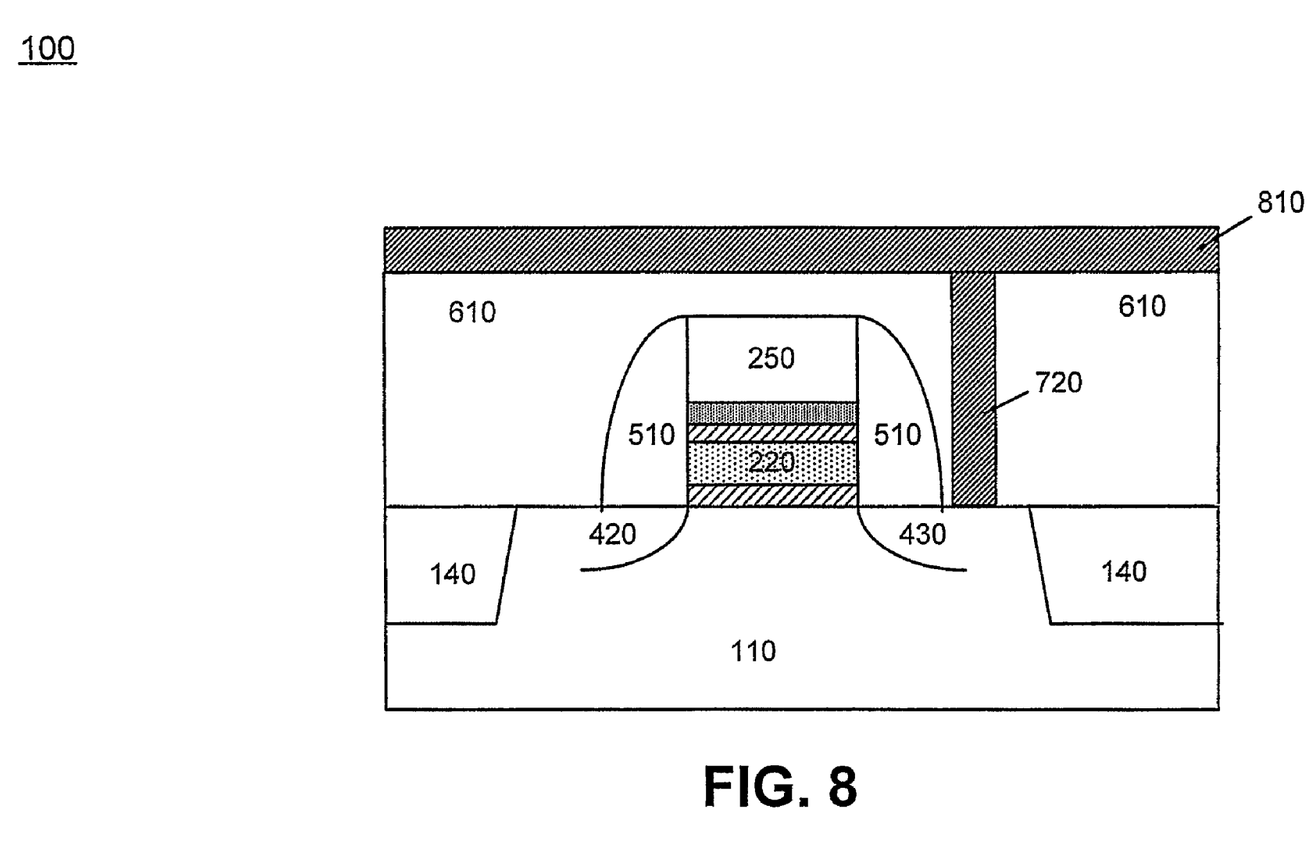
FIG. 8 is a cross-section illustrating the formation of a conductive interconnect on the device of FIG. 7B in accordance with an embodiment of the invention.

A conductive interconnect line 810 may then be formed over the planarized top surface of ILD 610, as illustrated in FIG. 8. For example, a metal, such as copper, aluminum or tungsten, may be deposited to form conductive line 810 that connects various features in semiconductor device 100, such as source or drain regions 420/430 through contact 720 to an external electrode (not shown). Alternatively, conductive line 810 may connect various memory cells 310 in semiconductor device 100. Conductive line 810 may facilitate programming or erasing various memory cells 310 in semiconductor device 100.

Figure 9:
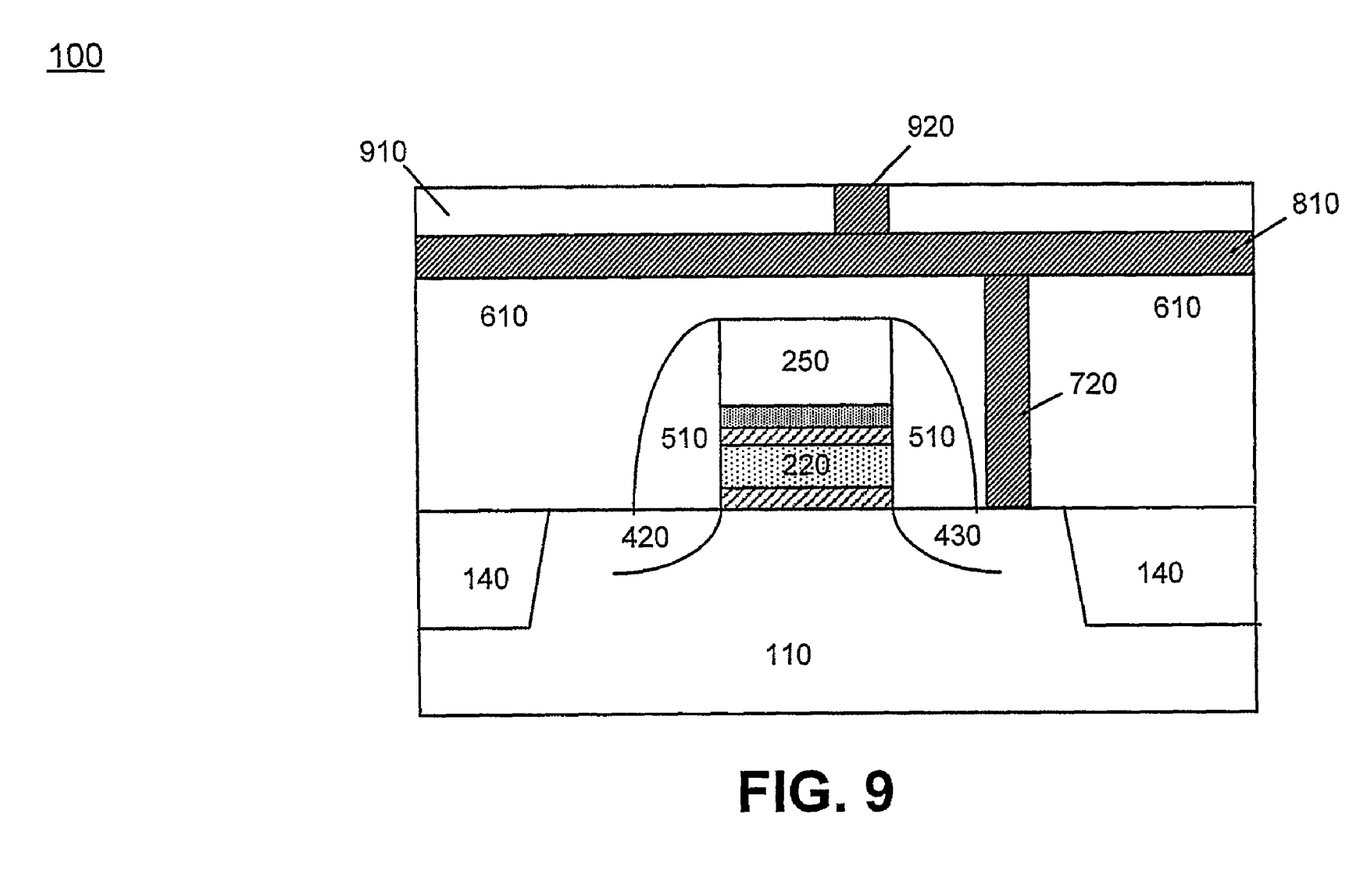
FIG. 9 is a cross-section illustrating the formation of an interlayer dielectric and a contact on the device of FIG. 8 in accordance with an embodiment of the invention.

An ILD 910 may be formed over conductive line 810, as illustrated in FIG. 9. In an exemplary implementation, ILD 910 may include an oxide, a PSG material, a BPSG material, an oxide or some other dielectric material. The thickness of ILD 910 may range from about 2,000 Å to about 10,000 Å.

Various back end of line (BEOL) processing may be performed to complete the fabrication of semiconductor device 100. For example, a contact hole/trench may be formed in ILD 910 followed by deposition of a metal layer 920, such as copper, aluminum or tungsten, as illustrated in FIG. 9. Metal layer 920 may represent a contact to an uppermost conductive layer of semiconductor device 100. Alternatively, metal layer 920 may represent a contact to any one of a number of conductive layers in semiconductor device 100.

Figure 10:
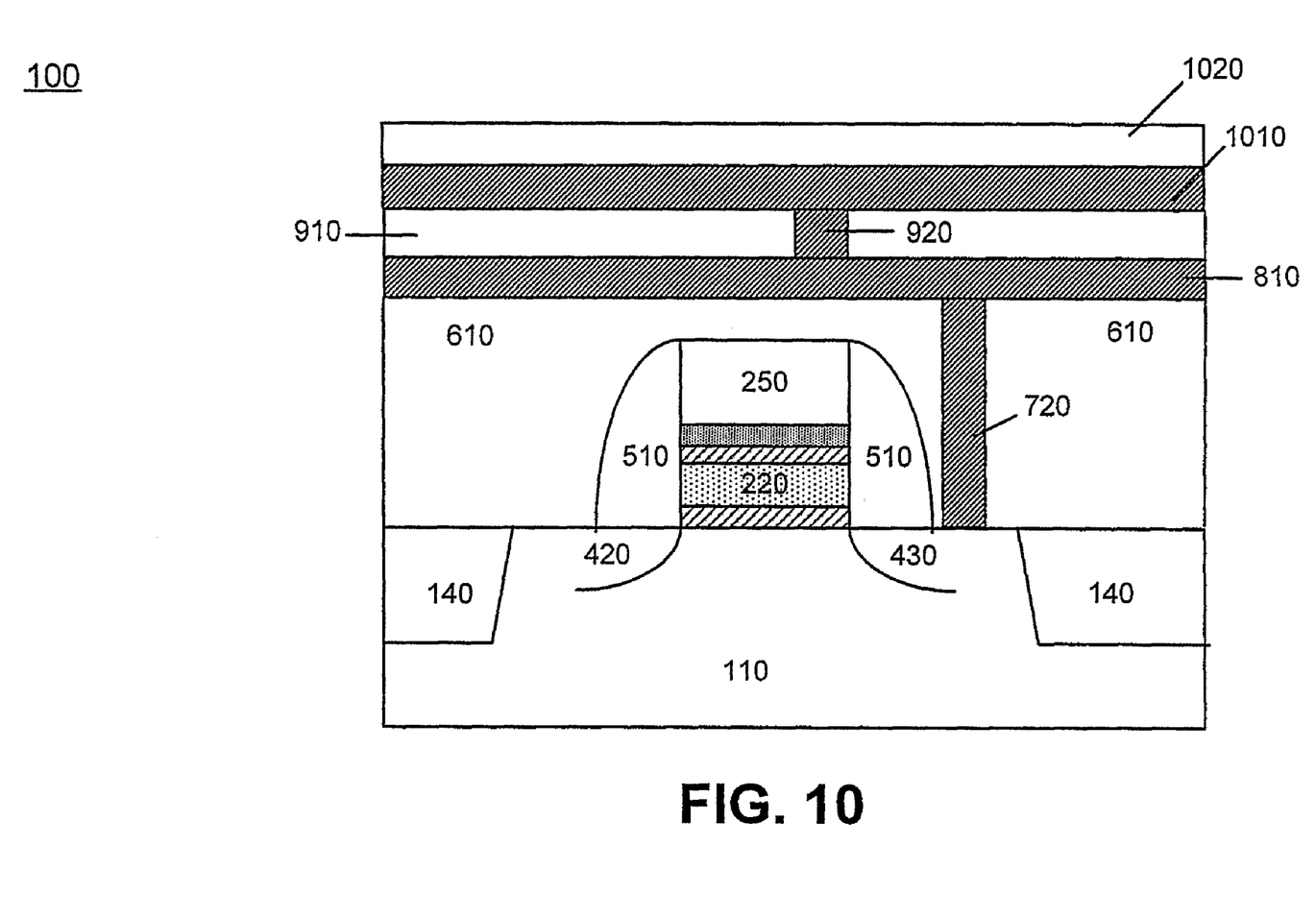
FIG. 10 is a cross-section illustrating the formation of a conductive layer and a dielectric layer on the device of FIG. 9 in accordance with an embodiment of the invention.

A conductive layer may then be formed over ILD 910. For example, a metal, such as copper, aluminum or tungsten, may be deposited to form conductive line 1010, as illustrated in FIG. 10. Conductive line 1010 may represent a BEOL structure or connector that connects various features in semiconductor device 100, such as source or drain regions 420/430 to an external electrode (not shown), to facilitate programming or erasing of various memory cells 310 in semiconductor device 100.

A top dielectric layer 1020, also referred to as cap layer 1020, may be formed over conductive line 1010. In an exemplary embodiment, cap layer 1020 may be deposited to a thickness ranging from about 5,000 Å to about 20,000 Å. Cap layer 1020 may act as a protective layer to prevent damage to conductive line 1010 and other portions of semiconductor device 100 during subsequent processing. For example, cap layer 1020 may protect semiconductor device 100 against impurity contamination during subsequent cleaning processes that may be used to complete a working memory device.

While only two ILDs (i.e., ILDs 610 and 910) and two conductive layers (i.e., layers 810 and 1010) are illustrated in FIG. 10 for simplicity, it should be understood that semiconductor device 100 may include more ILD layers and conductive layers based on the particular circuit requirements.

Memory cell 310 may be programmed by, for example, applying a voltage of about 6 volts to about 10 volts to control gate 250 and applying a voltage of about 3 volts to about 6 volts to drain region 430. Memory cell 310 may be programmed using Fowler-Nordheim (F-N) programming or channel hot electron programming. In each case, barrier layer 240 does not adversely affect programming speed and/or current requirements associated with programming memory cell 310. In addition, barrier layer 240 does not adversely impact erasing of memory cell 310, which may be erased using, for example, an F-N erase procedure.

As described above, in an exemplary embodiment, semiconductor device 100 illustrated in FIG. 10 may be a memory device that uses a dielectric material, such as $Si_3N_4$, to form charge storage layer 220. Each memory cell 310 may be an EEPROM type memory device and one or more programming circuits (not shown) may be used to facilitate programming and erasing of one or more memory cells 310 of semiconductor device 100. Once programmed, electrons remain trapped in layer 220 until an erase procedure is performed.

In an exemplary implementation consistent with the invention, each of the memory cells 310 in semiconductor device 100 may be configured to store two bits of data. That is, charge storage layer 220 may be programmed to store charges representing two separate bits of data by localizing the first and second charges to the respective left and right sides of charge storage layer 220 illustrated in FIG. 10. Each of the two bits of memory cell 310 may be programmed independently by, for example, channel hot electron injection or F-N programming, to store a charge representing a bit on each respective side of the charge storage layer 220. In this manner, the charges in charge storage layer 220 become effectively trapped on each respective side of charge storage layer 230. Erasing of each bit in memory cell 310 may also be performed independently. During erasing, the charges stored in charge storage layer 220 may tunnel through dielectric layer 210 into the source region 420 and drain region 430, respectively.

In this manner, the density of the array of memory cells 310 in semiconductor device 100 may be increased as compared to conventional memory devices that store only one bit of data per cell. In alternative implementations, each memory cell 310 may be configured to store one bit of data per memory cell 310. In addition, in alternative implementations, semiconductor device 100 may be a floating gate memory device in which charge storage layer 220 is formed from a conductive material, such as polycrystalline silicon, and functions as a charge storage element for each memory cell 310.

In summary, barrier layer 240 functions to prevent reactions between control gate 250 and inter-gate dielectric layer 230. Barrier layer 240 also does not adversely impact programming or erasing of memory cells 310. Therefore, barrier layer 240 advantageously helps improve overall operation and increases reliability for memory device 100.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A memory device, comprising:
   a substrate;
   a first dielectric layer formed on the substrate;
   a charge storage element formed on the first dielectric layer;
   a second dielectric layer formed on the charge storage element;
   a conductive layer comprising ruthenium formed on the second dielectric layer; and
   a control gate formed on the conductive layer, where the conductive layer functions as a barrier layer between the control gate and the second dielectric layer and prevents modification of a work function of the control gate.

2. The memory device of claim 1, where the conductive layer comprises ruthenium oxide.

3. The memory device of claim 2, where the conductive layer has a thickness ranging from about 50 Å to about 500 Å and does not function to store charge for the memory device.

4. The memory device of claim 1, where the first dielectric layer comprises silicon oxide, the charge storage element comprises silicon nitride, the second dielectric layer comprises silicon oxide and the control gate comprises polycrystalline silicon.

5. The memory device of claim 1, where the second dielectric layer comprises at least one of hafnium oxide, aluminum oxide or zirconium oxide and the charge storage element comprises at least one of hafnium oxide or aluminum oxide.

6. The memory device of claim 1, where the memory device includes a plurality of memory cells, each of the memory cells having a charge storage element to store charges representing two bits of information.

7. A non-volatile memory device, comprising:
   a plurality of memory cells, each of the memory cells including:
      a dielectric layer formed on a substrate,
      a charge storage element formed on the dielectric layer,
      an inter-gate dielectric formed on the charge storage element,
      a conductive barrier layer formed on the inter-gate dielectric, the barrier layer not functioning to store charge for the non-volatile memory device, and
      a control gate formed on the barrier layer, where the barrier layer prevents reaction between the control gate and the inter-gate dielectric and prevents modification of a work function of the control gate.

8. The non-volatile memory device of claim 7, where the barrier layer comprises at least one of ruthenium, iridium, zinc or cadmium.

9. A memory device, comprising:
   a substrate;
   a first dielectric layer formed on the substrate;
   a charge storage element formed on the first dielectric layer;
   an inter-gate dielectric formed on the charge storage element;
   a conductive layer formed on the inter-gate dielectric; and
   a control gate formed on the conductive layer, and where the conductive layer functions as a barrier to prevent reactions between the control gate and the inter-gate dielectric, does not function to store charge for the memory device, and prevents modification of a work function of the control gate.

10. The memory device of claim 9, where the memory device is programmed using Fowler-Nordheim programming or channel hot electron programming and erased using Fowler-Nordheim erasing.

11. The memory device of claim 1, where the charge storage element comprises at least one of hafnium oxide or aluminum oxide.

12. The non-volatile memory device of claim 7, where the barrier layer has a thickness ranging from about 50 Å to about 500 Å.

13. The non-volatile memory device of claim 7, where the barrier layer comprises ruthenium.

14. The non-volatile memory device of claim 13, where the barrier layer comprises ruthenium oxide and the control gate comprises silicon.

15. The non-volatile memory device of claim 7, where the charge storage element comprises a dielectric material to store charges representing two bits of data.

16. The non-volatile memory device of claim 7, where the charge storage element comprises polycrystalline silicon.

17. The memory device of claim 9, where the conductive layer comprises ruthenium oxide.

18. The memory device of claim 9, where the conductive layer has a thickness ranging from about 50 Å to about 500 Å.

19. The memory device of claim 9, where the conductive layer comprises ruthenium oxide, the control gate comprises silicon and the inter-gate dielectric comprises a material having a dielectric constant greater than about 3.9.

* * * * *